US010304957B2

(12) United States Patent
Roh et al.

(10) Patent No.: US 10,304,957 B2
(45) Date of Patent: May 28, 2019

(54) FINFET WITH REDUCED SERIES TOTAL RESISTANCE

(71) Applicant: QUALCOMM Incorporated, San Diego, CA (US)

(72) Inventors: Ukjin Roh, San Diego, CA (US); Shashank Ekbote, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 228 days.

(21) Appl. No.: 15/264,519

(22) Filed: Sep. 13, 2016

(65) Prior Publication Data

US 2018/0076326 A1    Mar. 15, 2018

(51) Int. Cl.
| | | |
|---|---|---|
| *H01L 21/02* | (2006.01) | |
| *H01L 29/78* | (2006.01) | |
| *H01L 29/165* | (2006.01) | |
| *H01L 29/167* | (2006.01) | |
| *H01L 21/265* | (2006.01) | |
| *H01L 29/08* | (2006.01) | |
| *H01L 29/66* | (2006.01) | |

(52) U.S. Cl.
CPC .... *H01L 29/7851* (2013.01); *H01L 21/02532* (2013.01); *H01L 21/02576* (2013.01); *H01L 21/26513* (2013.01); *H01L 29/0847* (2013.01); *H01L 29/165* (2013.01); *H01L 29/167* (2013.01); *H01L 29/66795* (2013.01); *H01L 29/785* (2013.01); *H01L 29/7848* (2013.01); *H01L 21/02636* (2013.01)

(58) Field of Classification Search
CPC .................................................. H01L 29/7851
USPC ........................................................... 257/190
See application file for complete search history.

(56) References Cited

U.S. PATENT DOCUMENTS

| | | | |
|---|---|---|---|
| 7,939,889 | B2 | 5/2011 | Yu et al. |
| 9,312,364 | B2 | 4/2016 | Harley et al. |
| 9,312,384 | B2 | 4/2016 | Lo et al. |
| 2007/0190731 | A1 | 8/2007 | Chen et al. |
| 2009/0152590 | A1 | 6/2009 | Adam et al. |
| 2011/0287600 | A1 | 11/2011 | Cheng et al. |
| 2012/0058610 | A1 | 3/2012 | Ookoshi et al. |
| 2013/0020612 | A1 | 1/2013 | Wann et al. |
| 2013/0234203 | A1 | 9/2013 | Tsai et al. |
| 2014/0349467 | A1 | 11/2014 | Chang et al. |
| 2015/0035008 | A1 | 2/2015 | Kittl et al. |
| 2015/0102348 | A1* | 4/2015 | Cai ...................... H01L 29/785 257/69 |
| 2016/0056290 | A1 | 2/2016 | Tsai et al. |
| 2016/0071978 | A1 | 3/2016 | Javorka et al. |
| 2016/0093740 | A1 | 3/2016 | Harley et al. |

FOREIGN PATENT DOCUMENTS

WO    WO 2007027473 A2 *   3/2007   ..... H01L 21/823814

OTHER PUBLICATIONS

International Search Report and Written Opinion—PCT/US2017/045972—ISA/EPO—dated Nov. 20, 2017.

* cited by examiner

*Primary Examiner* — Ajay Arora
(74) *Attorney, Agent, or Firm* — Haynes and Boone, LLP (57) ABSTRACT

Selective epitaxial growth is used to form a hetero-structured source/drain region to fill an etched recess in a silicon fin for an n-type FinFET device.

13 Claims, 8 Drawing Sheets

FINFET WITH REDUCED SERIES TOTAL RESISTANCE

TECHNICAL FIELD

This application relates generally to transistors, and more particularly to a fin-shaped field effect transistor with reduced series total resistance.

BACKGROUND

The formation of the source and drain contacts in a fin-shaped field effect (FinFET) transistor must overcome several obstacles. Users require low on-resistance, which would be satisfied by a heavy doping of the contacts. But such a heavy doping shortens the channel too much such that leakage is an issue. To provide low on-resistance, it is conventional to form each source/drain (S/D) contact in a recess etched into the fin using selective epitaxial growth (SEG) so as to widen the fin through the resulting SEG deposition within the fin recess.

The SEG deposition favors certain crystalline planes such that the SEG deposition does not assume the planar shape of the fin within the recess but instead assumes a diamond-shaped profile in which the angled sides of the profile are referred to as facets. The facets extend laterally from the fin such that the SEG deposition may cause neighboring fins to fuse or merge. The SEG deposition must thus be reduced for designs having a small length-of-diffusion (LOD) to prevent fin merger between adjacent FinFETs, which limits the desired reduction in on-resistance. In addition, an unstable contact landing can worsen the resistance in the facet region of minimum LOD devices. Moreover, the fin side wall surface typically has a <110> crystal orientation for n-type FinFETs. This is not the preferable direction for drivability. The on-resistance and drivability issues for n-type FinFETs thus have not been solved.

Accordingly, there is a need in the art for improved FinFETs having reduced on-resistance.

SUMMARY

A hetero-structured source/drain region is provided within the fin of an n-type FinFET through a selective epitaxial growth (SEG) process to reduce the source/drain total series resistance and contact resistivity. The SEG deposition occurs within an etched recess in the fin adjacent the gate spacers and includes a silicon buffer layer that lines the recess. A silicon germanium epitaxial layer covers the buffer layer. Finally, an in-situ n-typed doped silicon cap layer is SEG deposited over the silicon germanium layer to complete the hetero-structured deposition. In contrast to the cap layer, the silicon germanium and buffer layers may be deposited in an undoped state.

After deposition of the epitaxial layers, an ion-implantation step dopes the silicon germanium layer with a first concentration of an n-type dopant such as phosphorus and implants the cap layer with a second concentration of an n-type dopant such as arsenic, where the second concentration is greater than the first concentration. The resulting FinFET has reduced total series resistance and contact resistivity while minimizing short channel effects and leakage.

These and additional advantages may be better appreciated through the following detailed description.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

A hetero-structured source/drain region for an n-type FinFET device is provided that reduces the total series resistance and offers improved current drivability. The hetero-structured source/drain region is deposited using a selective epitaxial growth (SEG) process to fill a recess within a silicon fin adjacent the gate spacer with at least three epitaxial layers. A first epitaxial buffer layer of undoped silicon for the hetero-structured source/drain region lines the recess. A second epitaxial layer of undoped silicon germanium (SiGe) covering the buffer layer first is implant doped with phosphorus (Phi). A third (cap) epitaxial layer covers the SiGE layer and is in-situ doped with phosphorus and also implant doped with arsenic (As).

The energy of the implant doping of the SiGe epitaxial layer is controlled so that a projected range (Rp) of the phosphorus doping lies within the SiGe epitaxial layer adjacent its interface with the cap epitaxial layer. Similarly, the energy of the arsenic implantation in the cap epitaxial layer is controlled so that the projected range of the arsenic doping lies within the cap epitaxial layer and does not penetrate into the SiGe epitaxial layer. The resulting doping of the cap epitaxial layer results in a higher n-type dopant concentration in the cap epitaxial layer as compared to the n-type dopant concentration in the SiGe epitaxial layer. The hetero-structured source/drain regions for a FinFET device are quite advantageous in that the SiGE epitaxial layer provides a low source-drain resistance whereas the cap epitaxial layer reduces the contact resistivity. In addition, the doping of the hetero-structured source/drain regions provides for a shallow junction depth to minimize short channel effects. These advantageous properties may be better appreciated through the following example embodiments.

Figure 1A:
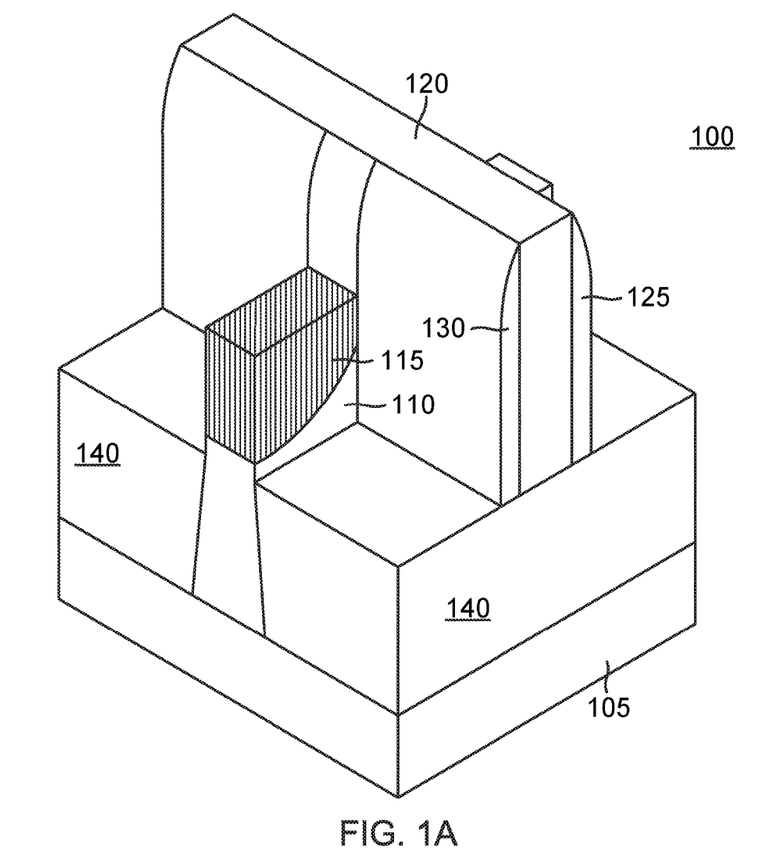
FIG. 1A is a perspective view of a FinFET device showing the fin region that will be removed to form a recess.

Both bulk FinFET and silicon-on-insulator (SOI) FinFET architectures benefit from the hetero-structured source/drain regions disclosed herein. A bulk FinFET 100 is shown in FIG. 1A prior to the etching of a source/drain recess 115 in a silicon fin 110. Silicon fin 110 is etched from a bulk silicon substrate 105 and isolated by shallow trench isolation regions 140. A gate electrode 120 (e.g., polysilicon, metal carbide, metal nitride, metal silicide, or other suitable materials as known in the FinFET arts) and spacers (e.g., silicon nitride, silicon oxide, or other suitable dielectric material)

Figure 1B:
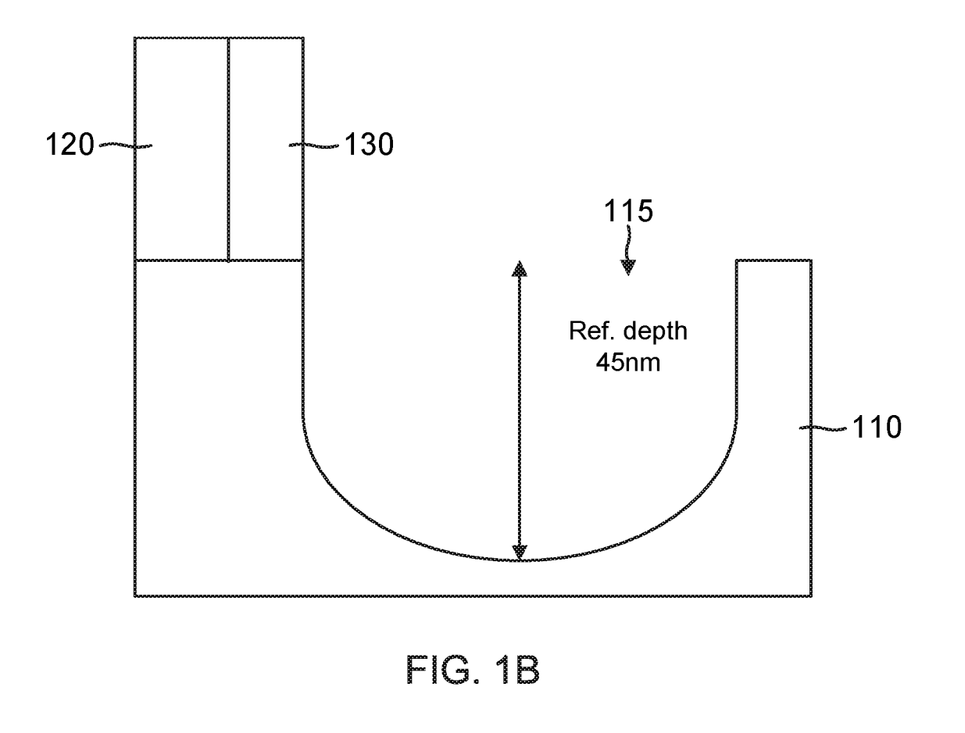
FIG. 1B is a side view of the FinFET device of FIG. 1A after an anisotropic recess formation.
Figure 1C:
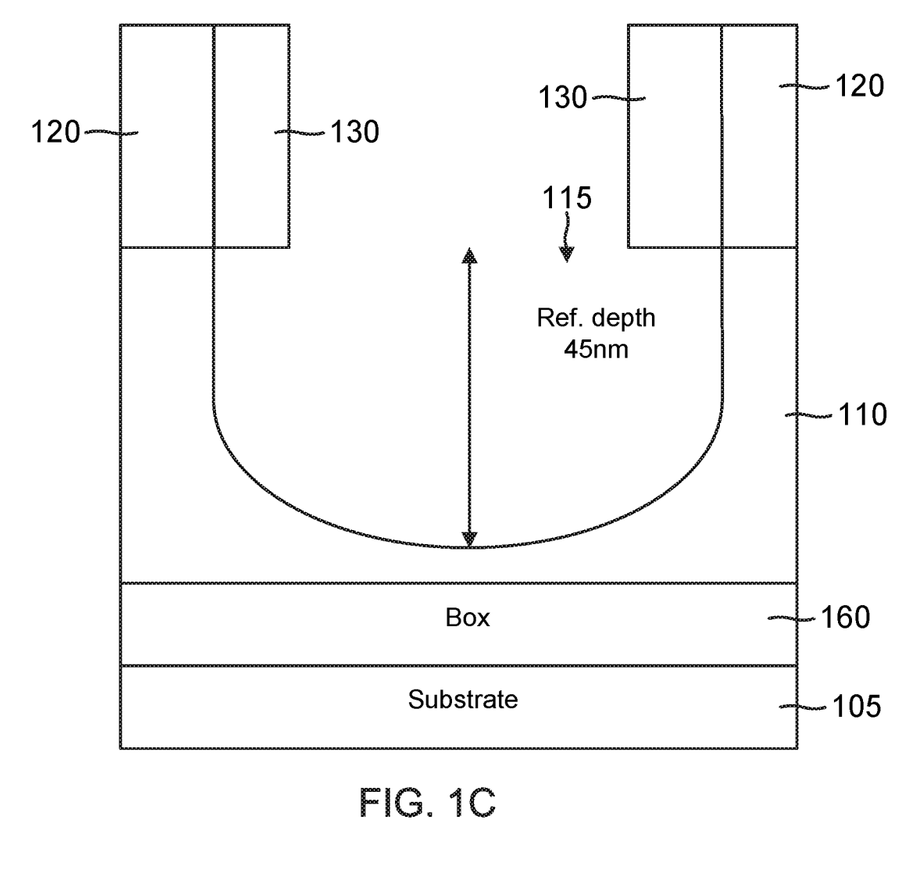
FIG. 1C is a side view of a SOI FinFET device after an isotropic recess formation.

130 and 125 are formed on fin 110. The sidewalls of fin 110 may have a <110> crystal orientation as is conventional for an n-type FinFET. Other orientations may be used in alternative embodiments. With the fin and gate formed, recess 115 is etched as shown in FIG. 1B. Either a wet or dry etch may be used. A dry etch such as a reactive ion etch (RIE) process forms an anisotropic etch such that a lateral edge of recess 115 is flush or aligned with a lateral border of spacer 130 (or 125). Alternatively, recess 115 may be wet etched such that recess 115 isotropically undercuts spacer 130 as shown in FIG. 1C for a silicon-on-insulator (SOI) architecture including a buried oxide layer 160 separating fin 110 from substrate 105. Etching generally occurs between a pair of gate electrodes 120 and their corresponding spacers 130 as shown in FIG. 1C. For illustration clarity, FIG. 1B shows just one gate electrode 120 and spacer 130.

Figure 2:
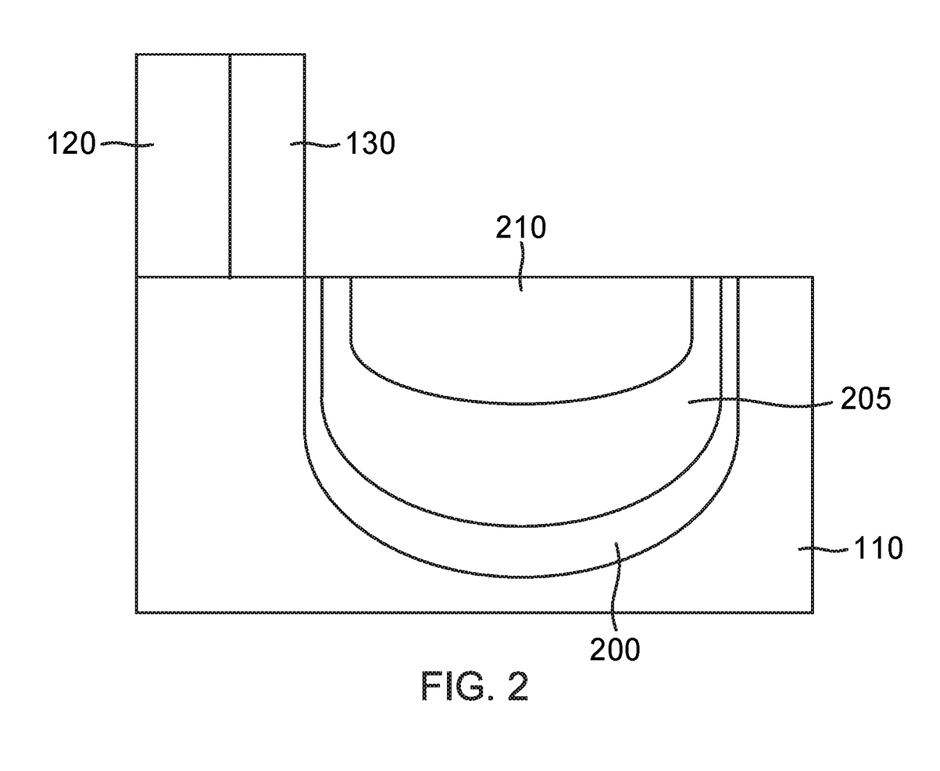
FIG. 2 is a side view of the FinFET device of FIG. 1B after a hetero-structured source/drain region is deposited in the recess through a selective epitaxial growth process in accordance with an aspect of the disclosure.

Regardless of whether an isotropic or anisotropic etching process is used to form recess 115, it is then lined with a first epitaxial undoped silicon buffer layer 200 as shown in FIG. 2 using a selective epitaxial growth process. The depth of recess 115 and thickness of buffer layer 200 depends upon the particular process node. For a 14 nm technology node, the depth of recess 115 from an upper surface of fin 110 is 45 nm in one embodiment. Similarly, the depth of buffer layer 200 may be approximately 8 nm in a 14 nm technology node. Buffer layer 200 functions to minimize junction leakage and control diffusivity to the channel and body. In addition, buffer layer 200 minimizes defects in the metallurgical junctions for the resulting n-type FinFET device.

An un-doped epitaxial SiGe layer 205 is then SEG deposited over buffer layer 200 in recess 115. The use of SiGe in a hetero-structured source/drain for an n-type FinFET is counter-intuitive in that is typically used for strain engineering of p-type FinFETs but its use in an n-type FinFET has been found herein to minimize the intrinsic bulk resistivity of the resulting source/drain region in fin 110. In that regard, the intrinsic bulk resistance of silicon germanium is markedly lower than silicon regardless of the annealing temperature. For example, at an annealing temperature of 700° C., the sheet resistance (ohm/centimeter squared) of phosphorus-doped SiGe is approximately 30 ohm/centimeter$^2$ whereas polysilicon has a sheet resistance of approximately 300 ohm/centimeter$^2$. The thickness of SiGE layer 205 depends upon the technology node but may be greater than 15 nm or even greater than 20 nm in a 14 nm technology node embodiment. Such a thickness provides residual strain relaxation. Finally, an epitaxial silicon cap layer 210 is SEG deposited over SiGe layer 205 to complete the hetero-structured source/drain deposition within recess 115. The thickness of cap layer 210 also depends upon the technology process node and may be less than 17 nm in thickness for a 14 nm technology process node embodiment. Unlike the other layers, cap layer 210 is in-situ doped during the SEG deposition with an n-type dopant such as phosphorus. The SEG deposition within recess 115 will naturally form facets since the selective epitaxial growth is preferred in certain crystal orientations. The SEG deposition must thus be controlled so that facets from one fin 110 do not short to facets on a neighboring fin 110. The hetero-structured SEG deposition disclosed herein provides reduced series total resistance and contact resistivity despite the SEG deposition being limited to prevent such facet overgrowth.

Figure 3:
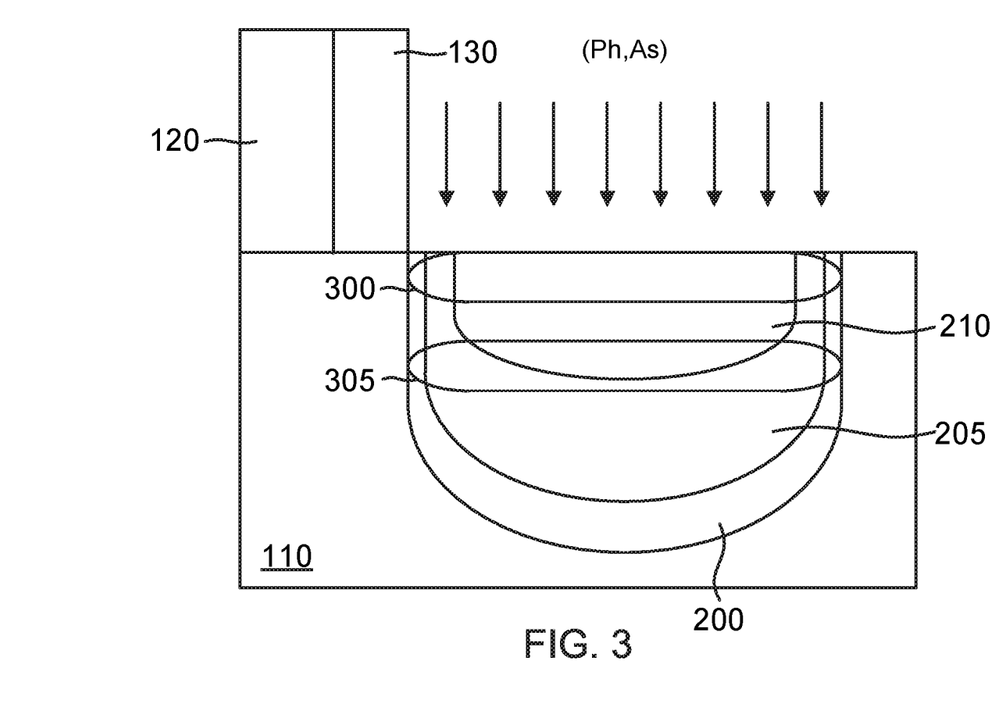
FIG. 3 is a side view of the FinFET device of FIG. 2 after implantation doping of the source/drain region.

An ion implantation process is then used to dope the silicon germanium layer 205 and cap layer 210 as shown in FIG. 3. Note that the diffusivity of arsenic and phosphorus dopants in silicon germanium is faster than in silicon. The diffusivity of such dopants in silicon germanium layer 205 will thus be greater as compared to the diffusivity in silicon cap layer 210. Regardless of whether the diffusion occurs in silicon germanium or silicon, note also that the diffusion of phosphorus occurs faster as compared to the diffusion of arsenic since phosphorus has a considerably lower molar mass. Arsenic ion implantation will thus diffuse over a smaller distance as compared to phosphorus ion implantation. Arsenic is therefore the n-type dopant that is implanted into cap layer 210 to minimize short channel effects from excessive diffusion into the channel. For example, arsenic may be implanted using an energy of approximately 3K electron volts to ensure that an arsenic projected range 300 remains within cap layer 210 and does not extend into silicon germanium layer 205. The resulting arsenic implantation lowers the Schottky barrier height (SBH) for cap layer 210 so that the contact resistance to the FinFET device is reduced. In that regard, the width of fin 110 should be less than the length of gate electrode 120 to achieve reduced drain-induced barrier lowering (DIBL). Such a relatively narrow width for fin 110 makes achieving reduced contact resistivity problematic. But the hetero-structured SEG deposition within recess 115 solves the contact resistivity problem that had vexed the prior art.

As compared to the arsenic implantation, the implantation energy for phosphorus should be sufficiently robust to ensure that a phosphorus projected range 305 lies within silicon germanium layer 205 and below cap layer 210. In this fashion, the relatively-fast diffusing phosphorus is prevented from implanting within cap layer 210 in any significant concentration so that it does not diffuse into the channel and aggravate short channel effects for the resulting n-type FinFET device. For example, an implantation energy of approximately 6 K electron volts for the phosphorus implantation may be used to ensure the appropriate depth for phosphorus projected range 305.

Figure 4:
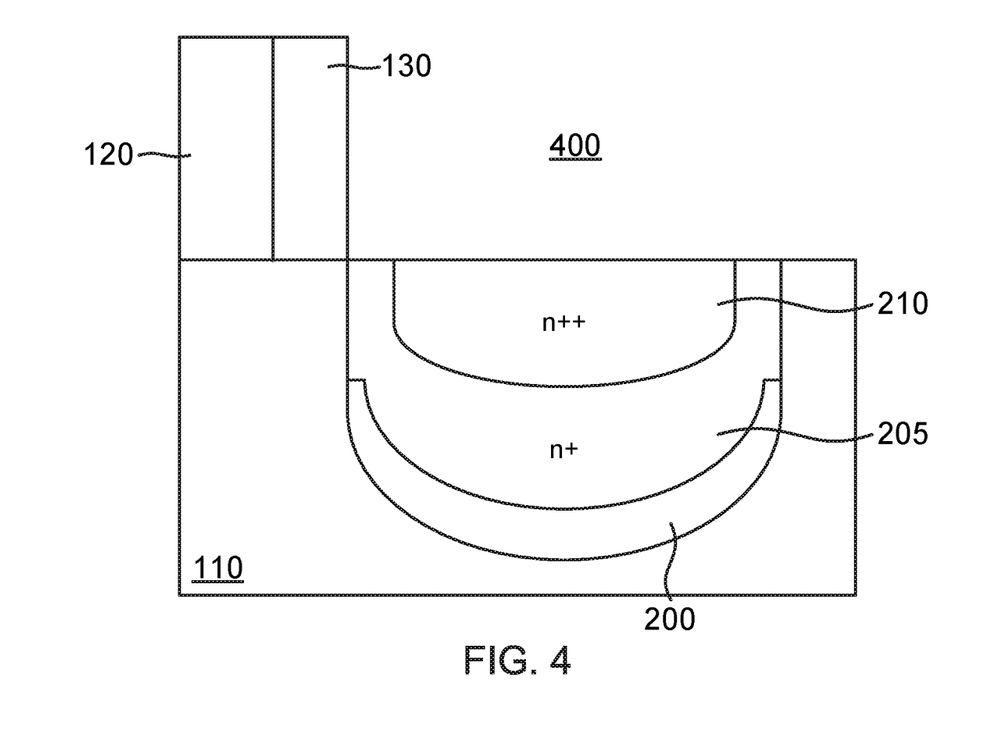
FIG. 4 is as side view of the FinFET device of FIG. 3 after annealing of the source/drain region.

Ion implantation causes considerable damage to the crystal lattice within fin 110 and can even cause it to assume an amorphous crystal orientation. The source/drain regions are thus annealed after ion implantation so that the crystal lattice may recrystallize through, for example, solid-phase or liquid-phase regrowth. The ion-implantation itself may be combined with the annealing process such as in a hot ion implantation process. An n-type FinFET device 400 in FIG. 4 is shown after ion implantation and annealing. The lateral diffusion of the arsenic and phosphorus ions have caused a lateral obliteration of buffer layer 200, which now resides only in the lower portions of recess 115. Silicon germanium layer 205 has diffused laterally and is n+ doped whereas cap layer 210 is n++ doped. The resulting combination of buffer layer 200, n+ doped silicon germanium layer 205, and n++ doped silicon cap layer 210 within recess 115 may be deemed in one embodiment to form a hetero-structured means within the recess for reducing a total series resistance and a contact resistance for an n-type FinFET device, the hetero-structured means including an n-type doped silicon germanium layer.

Figure 5:
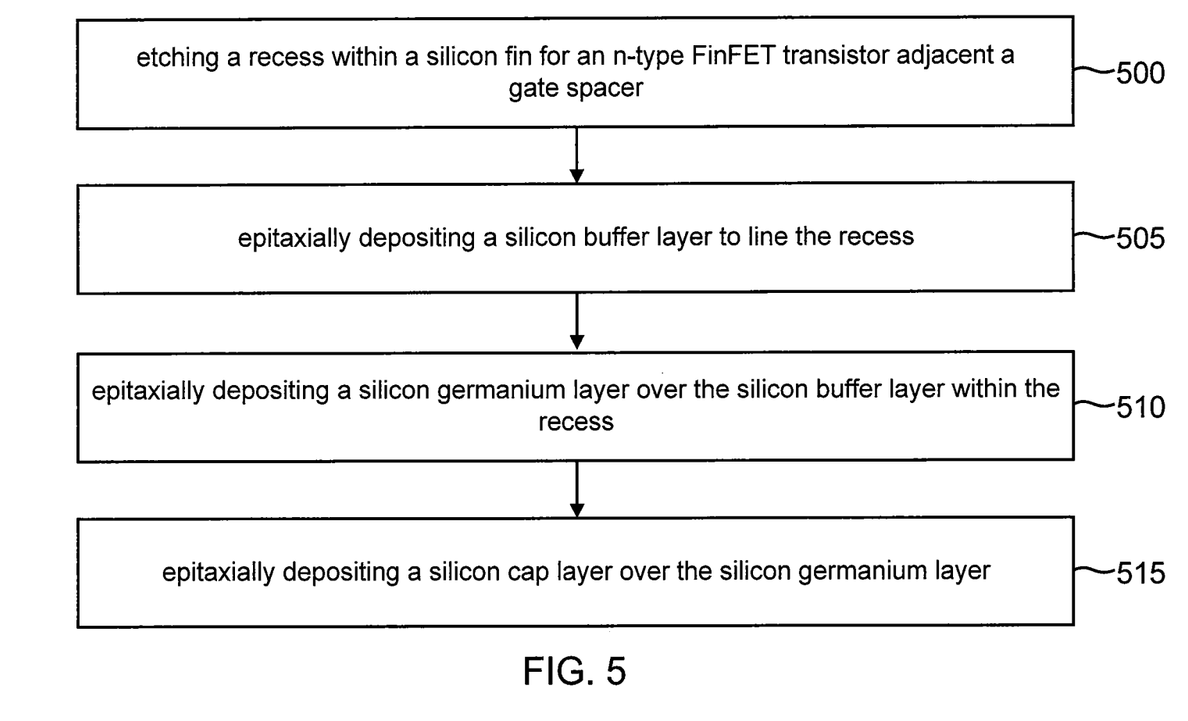
FIG. 5 is a flow chart for a method of manufacturing a FinFET having a hetero-structured source/drain region in accordance with an aspect of the disclosure.

A method of manufacturing for a FinFET source/drain region such as in FinFET 400 will now be discussed with regard to the flowchart of FIG. 5. The method begins with a step 500 of etching a recess within a silicon fin for an n-type FinFET device adjacent a gate spacer. The method further includes an act 505 of epitaxially depositing a silicon buffer layer 200 to line the recess. The method also includes an act 510 of epitaxially depositing a silicon germanium layer over the silicon buffer layer within the recess. Finally, the method includes an act 515 of epitaxially depositing a silicon cap layer over the silicon germanium layer.

Figure 6:
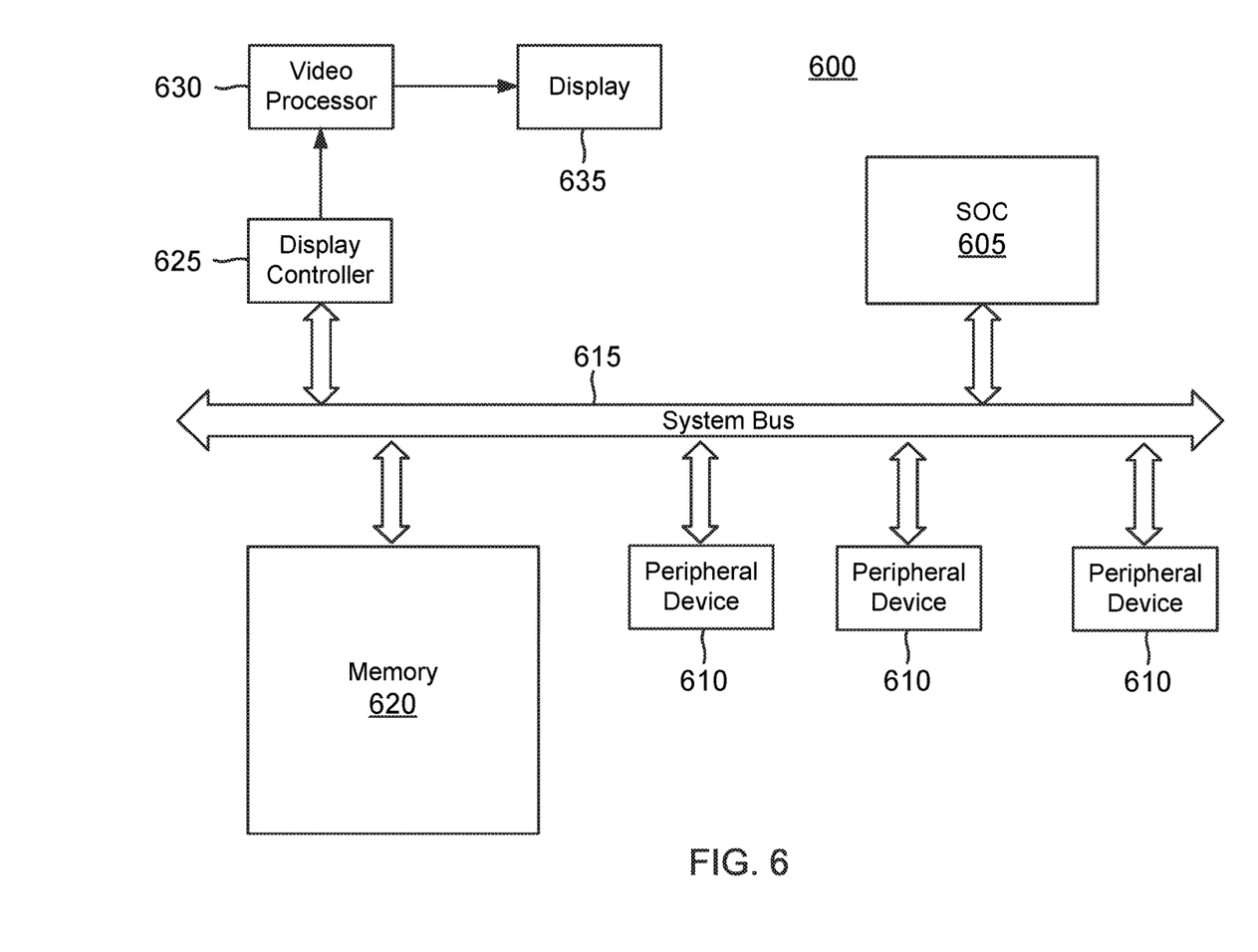
FIG. 6 is a block diagram for an example device incorporating the FinFET device of FIG. 4.

The reduced total series resistance and contact resistivity disclosed herein may be advantageously employed for n-type FinFETs within a system-on-a-chip (SoC) 605 in a device 600 as shown in FIG. 6. Device 600 may comprise a cellular phone, smart phone, personal digital assistant, tablet computer, laptop computer, digital camera, handheld gaming device, or other suitable device. SoC 605 communicates with a plurality of peripheral devices 610 such as sensors over a system bus 615 that also couples to a memory such as a DRAM 620 and to a display controller 625. In turn display controller 625 couples to a video processor 630 that drives a display 635.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents

What is claimed is:

1. An n-type FinFET device, comprising:
   a gate having a spacer;
   a silicon fin having a recess adjacent the spacer;
   an n-type-doped silicon germanium layer within the recess;
   an n-type-doped silicon cap layer covering the n-type-doped silicon germanium layer; and
   a silicon buffer layer lining a lower portion of the recess, wherein the n-type doped silicon germanium layer lies between the silicon buffer layer and the n-type doped silicon cap layer.

2. The n-type FinFET device of claim 1, wherein the recess has a lateral edge aligned with a lateral edge of the spacer.

3. The n-type FinFET device of claim 1, wherein the recess has a lateral edge that undercuts a lateral edge of the spacer.

4. The n-type FinFET device of claim 1, further comprising a shallow trench isolation region adjacent the silicon fin.

5. The n-type FinFET device of claim 1, further comprising a buried oxide region below the silicon fin.

6. The n-type FinFET device of claim 1, wherein the silicon buffer layer, the n-type-doped silicon germanium layer, and the n-type-doped silicon cap layer are all selective epitaxial growth layers.

7. The n-type FinFET device of claim 1, wherein the n-type-doped silicon cap layer is doped with arsenic and phosphorus, and wherein the n-type-doped silicon germanium layer is doped with phosphorus.

8. The n-type FinFET device of claim 7, wherein the phosphorus doping in the n-type-doped silicon germanium layer is an ion implantation that has a projected range that peaks within the n-type-doped doped silicon germanium layer adjacent an interface between the n-type-doped silicon germanium layer and the n-type-doped silicon cap layer.

9. The n-type FinFET of transistor claim 7, wherein the arsenic doping in the n-type-doped silicon cap layer is an ion implantation that has a projected range that peaks within the n n-type-doped silicon cap layer.

10. The n-type FinFET device of claim 7, wherein the phosphorus doping in the n-type-doped silicon cap layer is an in-situ phosphorus doping.

11. The n-type FinFET device of claim 1, wherein the recess has a rounded bottom.

12. The n-type FinFET device of claim 1, wherein an n-type dopant concentration for the n-type-doped silicon cap layer is greater than a concentration for an n-type dopant for the n-type-doped silicon germanium layer.

13. The n-type FinFET device of claim 1, wherein the n-type FinFET device is included in a device selected from the group consisting of a cellular phone, a smart phone, a personal digital assistant, a tablet computer, a laptop computer, a digital camera, and a handheld gaming device.

* * * * *